(12) United States Patent
Yeh et al.

(10) Patent No.: US 7,646,147 B2
(45) Date of Patent: Jan. 12, 2010

(54) ELECTRO-LUMINESCENCE PANEL

(75) Inventors: Hsien-Hsin Yeh, Sanchong (TW);
Min-Chieh Hu, Shanhua Township, Tainan County (TW); Yao-An Mo, Tainan (TW); Min-Ling Hung, Kanding Township, Pingtung County (TW)

(73) Assignee: AU Optronics Corp., Hsin-Chu (TW)

( * ) Notice: Subject to any disclaimer, the term of this patent is extended or adjusted under 35 U.S.C. 154(b) by 553 days.

(21) Appl. No.: 11/508,260

(22) Filed: Aug. 23, 2006

(65) Prior Publication Data

US 2007/0267971 A1 Nov. 22, 2007

(30) Foreign Application Priority Data

May 19, 2006 (TW) .............................. 95117932 A

(51) Int. Cl.
*H05B 33/00* (2006.01)

(52) U.S. Cl. .................. 313/512; 313/504; 313/506

(58) Field of Classification Search ............... None
See application file for complete search history.

(56) References Cited

U.S. PATENT DOCUMENTS

| 5,124,204 | A | 6/1992 | Yamashita et al. | |
| 6,628,071 | B1 * | 9/2003 | Su .......................... | 313/512 |
| 6,635,988 | B1 | 10/2003 | Izumizawa et al. | |
| 6,800,350 | B2 | 10/2004 | Van Hal et al. | |
| 6,803,127 | B2 | 10/2004 | Su et al. | |
| 7,256,543 | B2 * | 8/2007 | Su et al. ................ | 313/512 |
| 7,309,957 | B2 * | 12/2007 | Park et al. ............. | 313/504 |
| 7,495,390 | B2 * | 2/2009 | Park et al. ............. | 313/512 |
| 2002/0057565 | A1 * | 5/2002 | Seo ........................ | 362/84 |
| 2002/0172839 | A1 | 11/2002 | Van Hal et al. | |
| 2004/0090187 | A1 | 5/2004 | Wu et al. | |
| 2004/0135500 | A1 | 7/2004 | Omura | |
| 2005/0248270 | A1 | 11/2005 | Ghosh et al. | |

FOREIGN PATENT DOCUMENTS

| CN | 1309429 A | 8/2001 |
| JP | 1-231988 | 9/1989 |
| JP | 2003-282242 | 10/2003 |
| JP | 2004-139987 | 5/2004 |
| TW | 200307480 | 12/2003 |
| TW | 200403947 | 3/2004 |
| TW | I227450 | 2/2005 |
| TW | I232693 | 5/2005 |

\* cited by examiner

*Primary Examiner*—Ashok Patel
(74) *Attorney, Agent, or Firm*—Rabin & Berdo, PC

(57) ABSTRACT

An electro-luminescence (EL) panel is provided. The EL panel comprises a substrate, a cover, an EL device, and a buffer structure. The cover is disposed above the substrate. The EL device is disposed on the substrate and between the substrate and the cover. The buffer structure is disposed on the cover and between the EL device and the cover.

14 Claims, 7 Drawing Sheets

ELECTRO-LUMINESCENCE PANEL

This application claims the benefit of Taiwan application Serial No. 95117932, filed May 19, 2006, the subject matter of which is incorporated herein by reference.

BACKGROUND OF THE INVENTION

1. Field of the Invention

The invention relates in general to an EL panel, and more particularly to an EL panel having a buffer structure on the cover.

2. Description of the Related Art

Electro-luminescence (EL) panel featured by high contrast, energy saving, high color saturation, short response time and no restriction on view angle has become a display panel product with great potential. Currently, the packaging of the EL panel is done in a low-humidity and low oxygen environment. A sealant such as a photo-radiation solidifying binder is used to seal a substrate and a cover together, such that the EL device is contained therewithin. The cover has a water-absorbent material disposed therein. During the packaging process of the EL panel, the water-absorbent material absorbs the mist and decreases the humidity inside the panel after packaging.

Referring to F. 1, a diagram of a conventional EL panel is shown. The EL panel 1 comprises a substrate 10, a cover 11 and an EL device 12. The cover 11 is disposed above the substrate 10. The EL device 12 is disposed on the substrate 10 and between the cover 10 and the substrate 11. The cover 11 and the substrate 10 are coupled together by a sealant S. The EL panel 1 further comprises a water-absorbent material 13 disposed on the cover 11 for absorbing the mist and decreasing the humidity inside the EL panel 1.

The water-absorbent material 13 is a drying agent. The grains of the water-absorbent material 13 may come out and alight on the upper surface of the EL device 12. Even when the EL panel 1 is only slightly pressed or twisted, dot defects may occur to the pixels of the EL panel 1, particularly the pixels of the EL device, largely affecting the display quality of the EL panel.

SUMMARY OF THE INVENTION

It is therefore an object of the invention to provide an EL panel having a buffer structure on a cover and incorporating the buffer structure with a water-absorbent material. The buffer structure is closer to the EL device disposed on the substrate than the water-absorbent material. When the EL panel is pressed or twisted, the buffer structure enables the water-absorbent material to contact or keep a distance with the EL device such that the buffer function is achieved. Without affecting the absorbency of the water-absorbent material, the buffer structure prevents the EL device from being scratched or pressed by the grains alighted thereon, hence avoiding the occurrence of dot defects ot dead pixel. Thus, the yield rate and lifespan of the EL panel are improved.

The invention achieves the above-identified object by providing an EL panel comprising a substrate, a cover, an EL device and a buffer structure. The cover is disposed above the substrate. The EL device is disposed on the substrate and between the substrate and the cover. The buffer structure is disposed on the cover and between the EL device and the cover.

The invention further achieves the above-identified object by providing an EL panel comprising a substrate, a cover, an EL device, a buffer structure and a water-absorbent material. The cover is disposed above the substrate. The EL device is disposed on the substrate and between the substrate and the cover. The buffer structure is disposed on the cover and between the EL device and the cover. The water-absorbent material is disposed on the cover and between the cover and the buffer structure.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
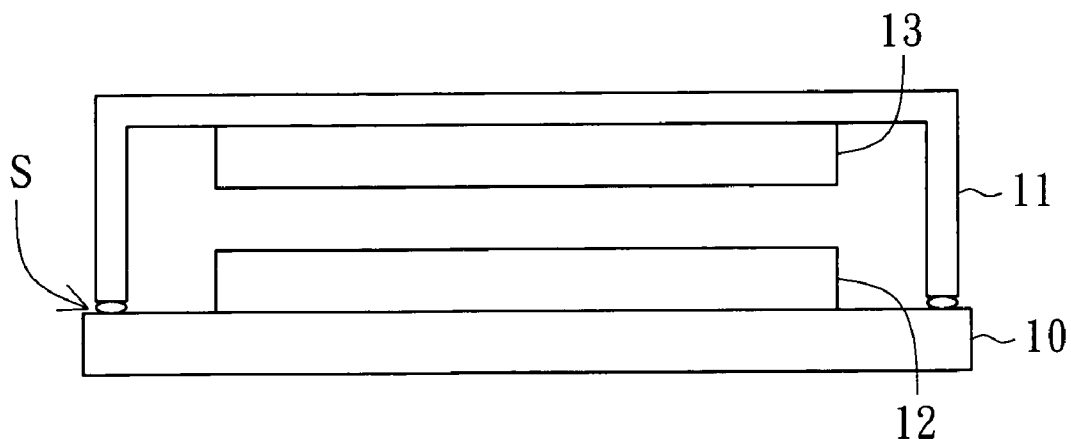
FIG. 1 is a diagram of a conventional EL panel.
Figure 2:
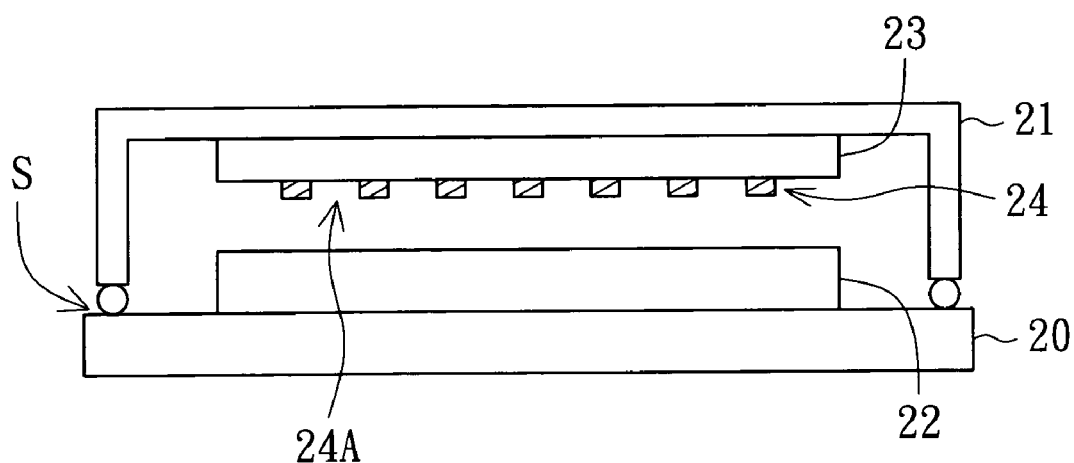
FIG. 2 is a diagram of an EL panel according to a first embodiment of the invention.

Referring to FIG. 2, a diagram of an EL panel according to a first embodiment of the invention is shown. As shown in FIG. 2, the EL panel 2 comprises a substrate 20, a cover 21, an EL device 22, a water-absorbent material 23 and a buffer structure 24. The cover 21 is disposed above the substrate 20. The EL device 22 is disposed on the substrate 20 and between the substrate 20 and the cover 21. The buffer structure 24 is disposed on the cover 21 and between the EL device 22 and the cover 21. The water-absorbent material 23 disposed on the cover 21 and between the cover 21 and the buffer structure 24 is or isn't in contact with the cover 21. The buffer structure 24 covers the water-absorbent material 23 and has at least an opening 24A. The opening 24A exposes the water-absorbent material 23, such that the water-absorbent material 23 can absorb the mist. The cover 21 and the substrate 20 are coupled together by a sealant S, such that the EL device 22 is disposed between the cover 21 and the substrate 20. The design of the buffer structure 24 is elaborated below.

Figure 3A:
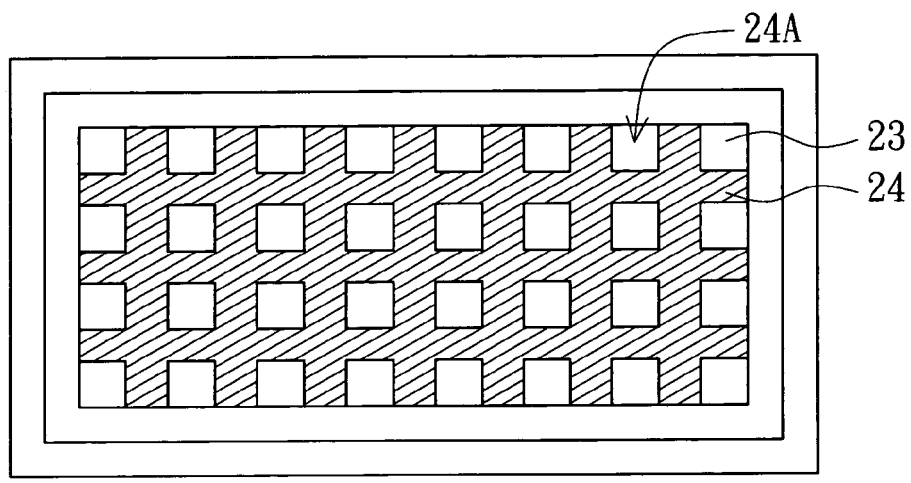
FIG. 3A is a first upward view of the cover of FIG. 2.

The buffer structure 24 is a structure with several openings. Referring to FIG. 3A, a first upward view of the cover of FIG. 2 is shown. As shown in FIG. 3A, the buffer structure 24 has several openings 24A. The openings 24A are regularly or irregularly distributed in the buffer structure 24 for exposing the water-absorbent material 23. Preferably, the openings 24A are regularly arranged such that the buffer structure 24 forms a mesh and covers the water-absorbent material 23.

Figure 3B:
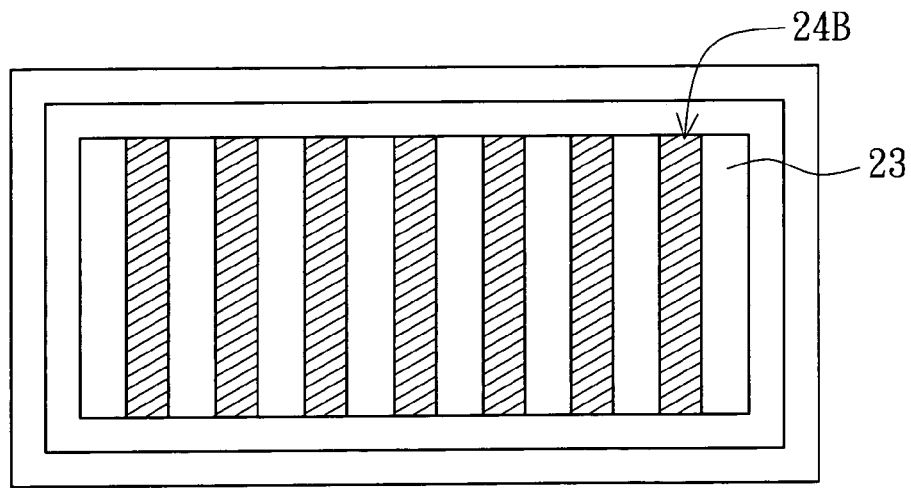
FIG. 3B is a second upward view of the cover of FIG. 2.

The buffer structure 24 can be designed as a structure composed of several elements. Referring to FIG. 3B, a second upward view of the cover of FIG. 2 is shown. As shown in FIG. 3B, the buffer structure 24 comprises several bars 24B regularly or irregularly disposed on the water-absorbent material 23. Preferably, the bars 24B are inter-spaced and disposed on the water-absorbent material 23 in parallel such that the water-absorbent material 23 can effectively absorb the mist and decreases the humidity inside the EL panel.

Figure 3C:
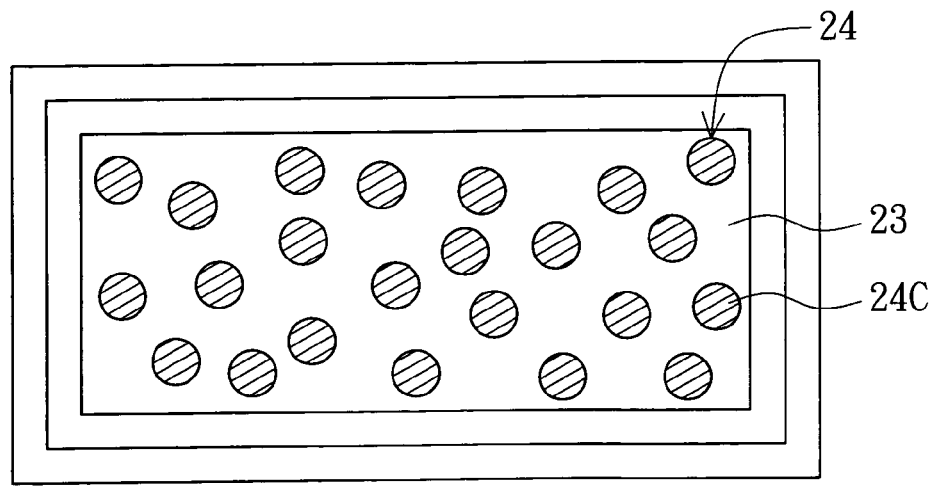
FIG. 3C is a third upward view of the cover of FIG. 2.

Referring to FIG. 3C, a third upward view of the cover of FIG. 2 is shown. As shown in FIG. 3C, the buffer structure 24 comprises several grains 24C. Likewise, the grains 24C are regularly or irregularly disposed on the water-absorbent material 23. The grains 24C are not restricted to any shape.

The design of the buffer structure 24 may be any of the designs disclosed above or a combination thereof or incorporate other designs. Preferably, the thickness of the buffer structure 24 is approximately 10 μm~50 μm. The buffer structure 24 may be formed on the water-absorbent material 23 by physical or chemical method such as pasting, coating, and printing or evaporation.

Example of the EL device 22 includes an organic light emitting diode (OLED), such that the EL panel 2 is an OLED panel. The material of the buffer structure 24 is preferably organic material such as polyethylene (PE), polypropylene (PP), polyurethane (PU), carbon nitrides (CNx) or Teflon.

After the buffer structure is disposed on the water-absorbent material, the grains generated by the water-absorbent material may come off and alight on the upper or the lateral surfaces of the EL device. When the EL panel is pressed or twisted, the buffer structure enables the water-absorbent material to keep an appropriate distance between the EL device and the grains, when pressed or twisted, might scratch the electrode of the EL device and cause damage to the EL device, and further reduce the yield rate of the EL panel.

Second Embodiment

Figure 4:
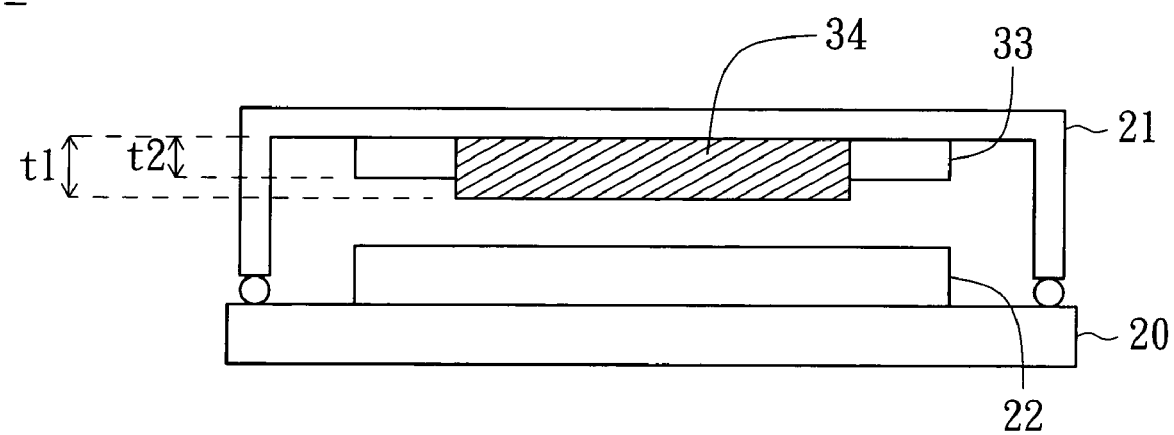
FIG. 4 is a diagram of an EL panel according to a second embodiment of the invention.

Referring to FIG. 4, a diagram of an EL panel according to a second embodiment of the invention is shown. The EL panel 3 of the present embodiment of the invention differs with the EL panel 2 of the first embodiment in the design of the water-absorbent material and the buffer structure. As for other similar elements, the same reference labels are used and their connections are not repeated here. As shown in FIG. 4, the buffer structure 34 and the water-absorbent material 33 are adjacent to each other and disposed on the cover 21. The thickness $t_1$ of the buffer structure 34 is greater than the thickness $t_2$ of the water-absorbent material 33. Preferably, the thickness $t_1$ of the buffer structure 34 is greater than the thickness $t_2$ of the water-absorbent material 33 by approximately 10 μm~50 μm. The thickness $t_1$ of the buffer structure 34 may be approximately 10 μm~50 μm.

Figure 5A:
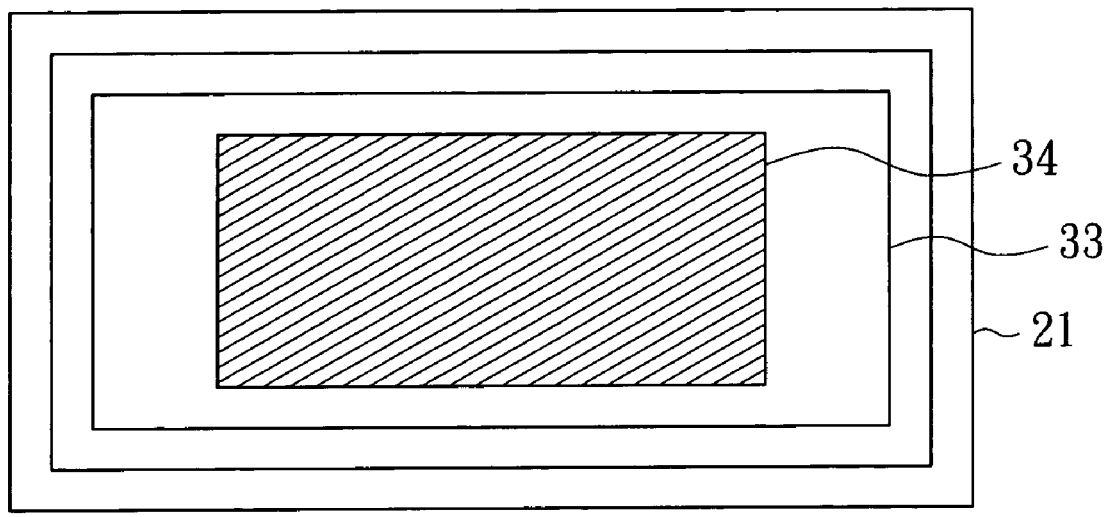
FIGS. 5A~5B are upward views of the cover of FIG. 4.
Figure 5B:
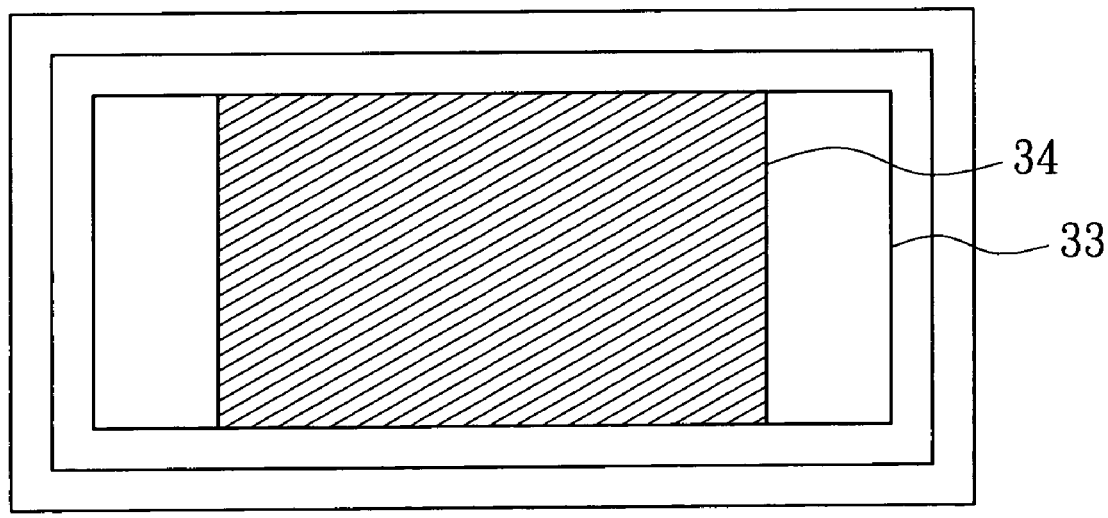

Referring to FIGS. 5A~5B, two upward views of the cover of FIG. 4 are shown. The buffer structure 34 and the water-absorbent material 33 disposed on the cover 21 are adjacent to each other. The buffer structure 34 may pass through the water-absorbent material 33 as shown in FIG. 5A. Or, two lateral edges of the buffer structure 34 are engaged with two lateral edges of the water-absorbent material 33 as shown in FIG. 5B. During the manufacturing process, the buffer structure 34 is placed into the raw materials of the water-absorbent material 33 or a raw materials containing the water-absorbent material 33 firstly. And the raw materials of the water-absorbent material 33 or the raw materials containing the water-absorbent material 33 is disposed in a molding container for the buffer structure 34 and the water-absorbent material 33 to be integrally formed in one piece. Then the buffer structure 34 and the water-absorbent material 33, which have already been formed in one piece, are pasted on the cover 21 at the same time. If the cover 21 is pressed, the buffer structure 34 can still provide support and protection to the EL device without affecting the absorbency of the water-absorbent material 33.

Third Embodiment

Figure 6:
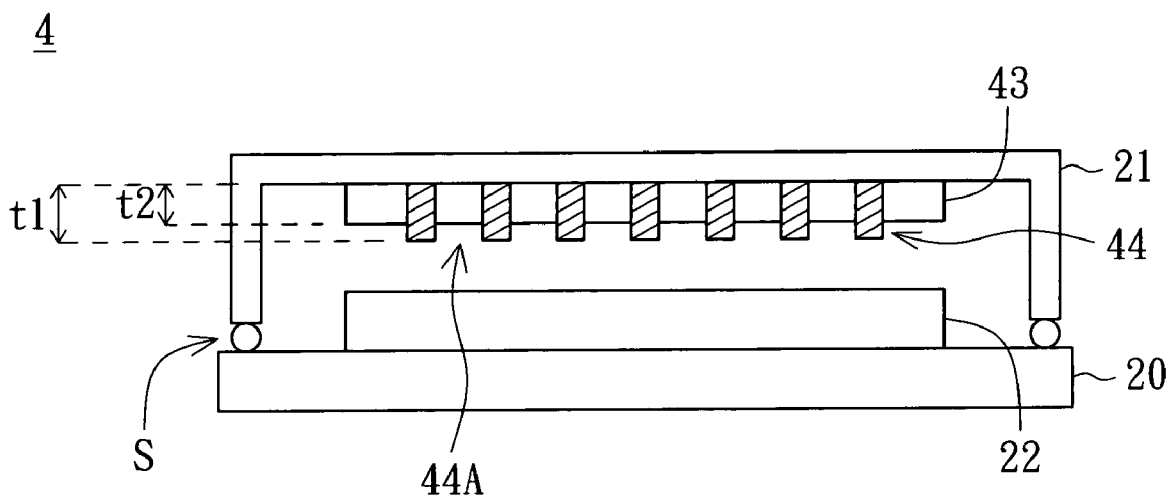
FIG. 6 is a diagram of an EL panel according to a third embodiment of the invention.

Referring to FIG. 6, a diagram of an EL panel according to a third embodiment of the invention is shown. The EL panel 4 of the present embodiment of the invention differs with the EL panel 2 of the first embodiment in the designs of the water-absorbent material and the buffer structure. As for other similar elements, the same reference labels are used and their connections are not repeated here. As shown in FIG. 6, the water-absorbent material 43 and the buffer structure 44 are adjacent to each other and disposed on the cover 21. The thickness $t_1$ of the buffer structure 44 is greater than the thickness $t_2$ of the water-absorbent material 43. Preferably, the thickness $t_1$ of the buffer structure 44 is greater than the thickness $t_2$ of the water-absorbent material 43 by approximately 10 μm~50 μm. The buffer structure 44 has at least an opening 44A. The design of the buffer structure 44 is elaborated below.

Figure 7A:
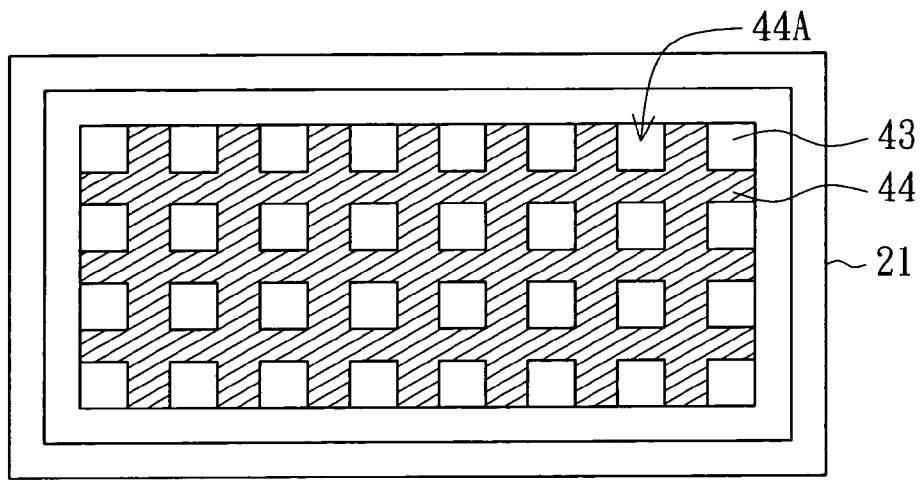
FIG. 7A is a first upward view of the cover of FIG. 6.

Referring to FIG. 7A, a first upward view of the cover of FIG. 6 is shown. As shown in FIG. 7A, the buffer structure 44 has several openings 44A regularly or irregularly formed in the buffer structure 44 such that the buffer structure 44 forms a mesh. Preferably, the openings 44A are regularly arranged. During the manufacturing process, firstly the raw materials of the water-absorbent material 43 is evenly spread in the openings 44A for the buffer structure 44 and the water-absorbent material 43 to be integrally formed in one piece. Then the buffer structure 44 and the water-absorbent material 43, which have already been integrally formed in one piece, are disposed on the cover 21.

Figure 7B:
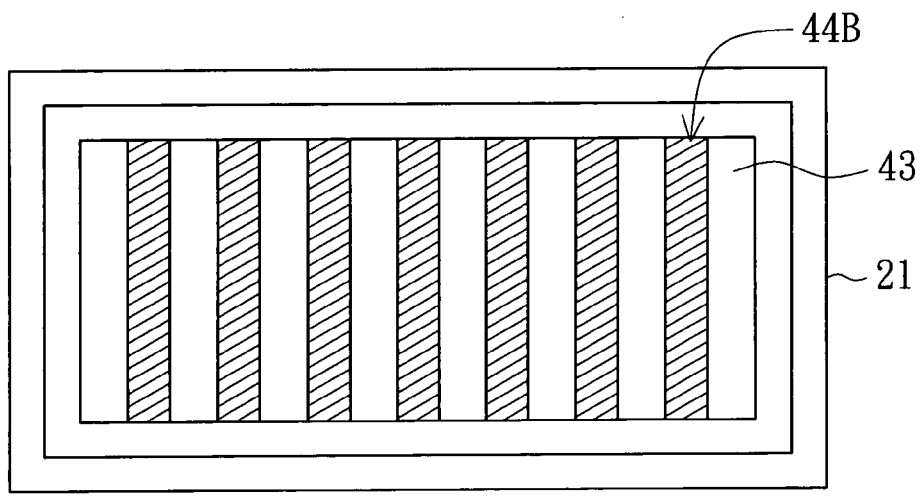
FIG. 7B is a second upward view of the cover of FIG. 6.

Referring to FIG. 7B, a second upward view of the cover of FIG. 6 is shown. As shown in FIG. 7B, the buffer structure 44 comprises several bars 44B. Preferably, the bars 44B are disposed in the water-absorbent material 43 in parallel. The buffer structure 44 and the water-absorbent material 43 are inter-spaced and the buffer structure 44 forms a railing structure. In the process of manufacturing the EL panel, firstly the bars 44B are placed in the raw materials of the water-absorbent material 43 for the buffer structure 44 and the water-absorbent material 43 to be integrally formed in one piece, and then pasted on the cover 21.

Figure 7C:
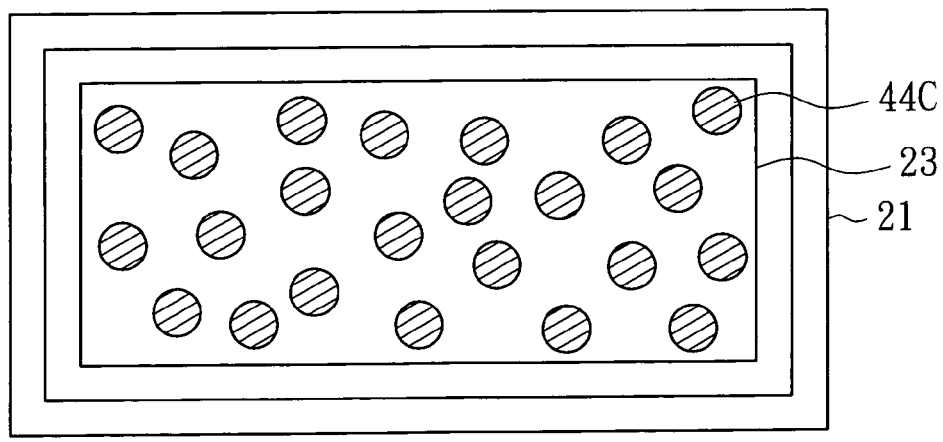
FIG. 7C is a third upward view of the cover of FIG. 6.

Referring to FIG. 7C, a third upward view of the cover of FIG. 6 is shown. As shown in FIG. 7C, the buffer structure 44 comprises several grains 44C. In the process of manufacturing the EL panel, the grains 44C preferably have elasticity and are firstly mixed with the raw materials of the water-absorbent material 43, and then the raw materials containing grains 44C is rolled for controlling the thickness of the water-absorbent material 43. After rolling, the grains 44C restore to their original size. Then thickness of the buffer structure 44 consisting of several grains 44C is greater than the thickness of the water-absorbent material 43.

The buffer structure disclosed in the present embodiment of the invention and the water-absorbent material are disposed on the cover either side by side or with an inter-space. The thickness of the buffer structure is greater than the thickness of the water-absorbent material.

Fourth Embodiment

Figure 8:
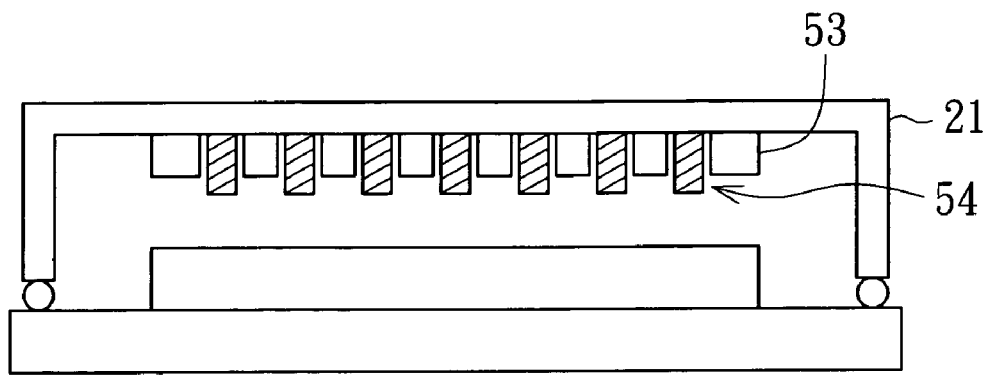
FIG. 8 is a diagram of an EL panel according to a fourth embodiment of the invention.

Referring to FIG. 8, a diagram of an EL panel according to a fourth embodiment of the invention is shown. The EL panel 5 of the present embodiment of the invention differs with the EL panel 4 of the third embodiment in the design of the buffer structure 54 and the water-absorbent material 53. As shown in FIG. 8, the buffer structure 54 and the water-absorbent material 53 are inter-spaced and disposed on the cover 21. The buffer structure 54 and the water-absorbent material 53 are inter-spaced and alternately disposed on the cover 21.

Fifth Embodiment

Figure 9:
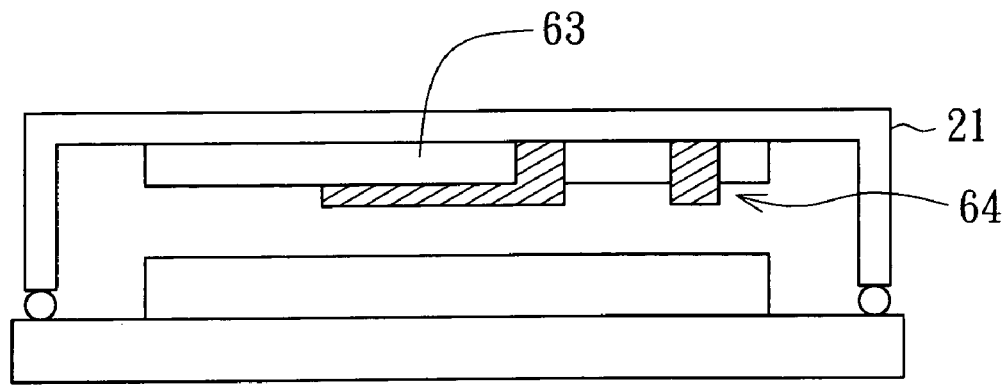
FIG. 9 is a diagram of an EL panel according to a fifth embodiment of the invention.

Referring to FIG. 9, a diagram of an EL panel according to a fifth embodiment of the invention is shown. The EL panel 6 of the present embodiment of the invention differs with the EL panel of previous embodiments in the design of the buffer structure 54 and the water-absorbent material 53. As shown in FIG. 9, a portion of the buffer structure 64 covers a portion of the water-absorbent material 63, while the remaining portion of the buffer structure 64 and the remaining portion of the water-absorbent material 63 cover a portion of the cover 21.

According to the EL panel disclosed in the above embodiments of the invention, the buffer structure combined with the water-absorbent material becomes a protection layer to the water-absorbent material. Or, the buffer structure and the water-absorbent material, which are alternate side by side or with inter-space, are disposed on the cover of the EL panel. The thickness of the buffer structure is greater than the thickness of the water-absorbent material such that the buffer structure is closer to the EL device than the water-absorbent material. Example of the buffer structure includes several adjacent or isolated bars, meshes, grains or structures of other shapes. The manufacturing process of the EL panel is simple and easy since the buffer structure can be formed on the water-absorbent material by pasting, coating, printing or evaporation. When the EL panel is pressed or twisted, the buffer structure enables the water-absorbent material to keep a distance with the EL device lest the grains, when pressed or twisted, might scratch the electrode of the EL device and cause damage to the EL device, and further reduce the yield rate of the EL panel.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electro-luminescence (EL) panel, comprising:
a substrate;
a cover disposed above the substrate;
an EL device disposed on the substrate and between the substrate and the cover;
a buffer structure disposed and formed on the cover and between the EL device and the cover; and
a water-absorbent material formed on the cover, wherein the thickness of the buffer structure is greater than the thickness of the water-absorbent material.

2. The EL panel according to claim 1, wherein the EL device comprises an organic light emitting diode (OLED).

3. The EL panel according to claim 1, wherein the thickness of the buffer structure is approximately 10 μm to 50 μm.

4. The EL panel according to claim 1,
wherein the water-absorbent material is disposed adjacent to the buffer structure.

5. The EL panel according to claim 4, wherein the buffer structure and the water-absorbent material are disposed inter-spaced.

6. The EL panel according to claim 4, wherein the buffer structure is a mesh.

7. The EL panel according to claim 4, wherein the buffer structure comprises a plurality of bars.

8. The EL panel according to claim 7, wherein the bars are disposed in parallel.

9. The EL panel according to claim 4, wherein the buffer structure comprises a plurality of grains.

10. The EL panel according to claim 4, wherein the thickness of the buffer structure is greater than the thickness of the water-absorbent material by approximately 10 μm to 50 μm.

11. The EL panel according to claim 1, wherein the buffer structure includes an organic material.

12. The EL panel according to claim 1, wherein the buffer structure includes polyethylene (PE), polypropylene (PP), polyurethane (PU), carbon nitrides (CNx), Teflon, or combinations thereof.

13. An electro-luminescence (EL) panel, comprising:
a substrate;
a cover disposed above the substrate;
an EL device disposed on the substrate and between the substrate and the cover;
a buffer structure disposed and directly formed on the cover and between the EL device and the cover; and
a water-absorbent material disposed on the cover and only a portion thereof being located between the cover and the buffer structure.

14. The EL panel according to claim 13, wherein the buffer structure has at least one opening to expose the water-absorbent material.

* * * * *

UNITED STATES PATENT AND TRADEMARK OFFICE
CERTIFICATE OF CORRECTION

PATENT NO. : 7,646,147 B2 Page 1 of 1
APPLICATION NO. : 11/508260
DATED : January 12, 2010
INVENTOR(S) : Yeh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 695 days.

Signed and Sealed this

Sixteenth Day of November, 2010

David J. Kappos
*Director of the United States Patent and Trademark Office*